(12) United States Patent
Shepelev

(10) Patent No.: US 10,977,980 B2
(45) Date of Patent: Apr. 13, 2021

(54) GATE SELECT SIGNAL WITH REDUCED INTERFERENCE

(71) Applicant: SYNAPTICS INCORPORATED, San Jose, CA (US)

(72) Inventor: Petr Shepelev, Campbell, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 17/036,755

(22) Filed: Sep. 29, 2020

(65) Prior Publication Data

US 2021/0012695 A1    Jan. 14, 2021

Related U.S. Application Data

(63) Continuation of application No. 16/437,450, filed on Jun. 11, 2019, now Pat. No. 10,825,373.

(51) Int. Cl.
   *G09G 3/20* (2006.01)
(52) U.S. Cl.
   CPC ........... *G09G 3/20* (2013.01); *G09G 2310/08* (2013.01); *G09G 2330/06* (2013.01)
(58) Field of Classification Search
   None
   See application file for complete search history.

(56) References Cited

U.S. PATENT DOCUMENTS

| 2008/0303772 | A1  | 12/2008 | Ruckmongathan |
| 2009/0309869 | A1  | 12/2009 | Umeda |
| 2017/0206853 | A1* | 7/2017  | Koide ............. G09G 3/3696 |

FOREIGN PATENT DOCUMENTS

KR    20050122688 A    12/2005

* cited by examiner

*Primary Examiner* — Aneeta Yodichkas
(74) *Attorney, Agent, or Firm* — Leydig, Voit & Mayer, Ltd.

(57) ABSTRACT

A processing system for a display device comprises a display driver configured to generate a gate select signal and output the gate select signal to gate select control circuitry to be driven on gate lines for display updating. The gate select signal comprises a transition from a first voltage to a second voltage, a transition from the second voltage to a third voltage, and a transition from the third voltage to the first voltage. The second voltage is greater than the first voltage and the second voltage is maintained for a first period. The third voltage is greater than the second voltage and the third voltage is maintained for a second period. The gate select signal is driven by the gate select control circuitry on gate lines of the display device to select one or more subpixels of the display device for display updating.

20 Claims, 7 Drawing Sheets

GATE SELECT SIGNAL WITH REDUCED INTERFERENCE

CROSS REFERENCE TO RELATED APPLICATIONS

This application is a continuation of U.S. patent application Ser. No. 16/437,450, filed Jun. 11, 2019, which is hereby incorporated herein by reference.

BACKGROUND

Field

The disclosure herein is generally related to electronic devices, and more specifically, to generating gate select signals in a display device. Description of the Related Art Input devices including proximity sensor devices may be used in a variety of electronic systems. A proximity sensor device may include a sensing region, demarked by a surface, in which the proximity sensor device determines the presence, location, force and/or motion of one or more input objects. Proximity sensor devices may be used to provide interfaces for the electronic system. For example, proximity sensor devices may be used as input devices for larger computing systems, such as touchpads integrated in, or peripheral to, notebook or desktop computers. Proximity sensor devices may also often be used in smaller computing systems, such as touch screens integrated in cellular phones. Additionally, proximity sensor devices may be implemented as part of a multi-media entertainment system of an automobile.

SUMMARY

In one embodiment, a processing system for a display device comprises a display driver configured to generate a gate select signal and output the gate select signal to gate select control circuitry. The gate select signal comprises a transition from a first voltage to a second voltage, a transition from the second voltage to a third voltage, and a transition from the third voltage to the first voltage. The second voltage is greater than the first voltage and the second voltage is maintained for a first period. The third voltage is greater than the second voltage and the third voltage is maintained for a second period. The gate select signal is driven on gate lines of the display device to select one or more subpixels of the display device for display updating by the gate select control circuitry.

In one embodiment, a method for controlling the selection of gate lines comprises generating a gate select signal and communicating the gate select signal to gate control circuitry configured to drive the gate select signal on a first one of the gate lines for display updating. The gate select signal has a plurality of voltages and generating the gate select signal comprises transitioning the gate select signal from a first voltage to a second voltage, transitioning the gate select signal from the second voltage to a third voltage, and transitioning the gate select signal from the third voltage to the first voltage. The second voltage is greater than the first voltage and is maintained for a first period, and the third voltage is greater than the second voltage and is maintained for a second period.

In one embodiment, a display device comprises a plurality of gate lines, gate control circuitry coupled to the plurality of gate lines, and display driver circuitry coupled to the gate control circuitry. The display driver circuitry is configured to generate a gate select signal comprising a transition from a first voltage to a second voltage, a transition from the second voltage to a third voltage, and a transition from the third voltage to the first voltage. The second voltage is greater than the first voltage and is maintained for a first period, and the third voltage is greater than the second voltage and is maintained for a second period. The display driver circuitry is further configured to output the gate select signal to the gate control circuitry. The gate control circuitry is configured to drive the gate select signal on a first one of the gate lines for display updating.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

Figure 1:
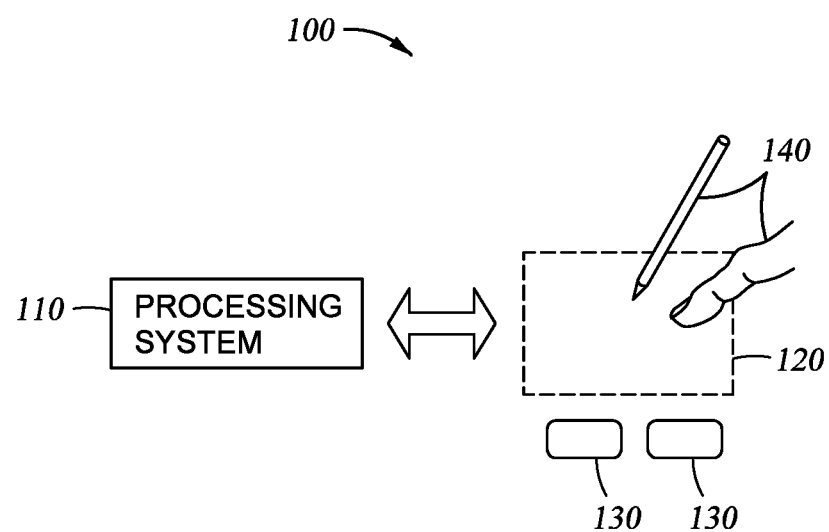
FIG. 1 illustrates an example input device, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

An example input device 100 as shown in FIG. 1 in accordance with embodiments of the disclosure may be configured to provide input to an electronic system. As used in this document, the term "electronic system" broadly refers to any system capable of electronically processing information. Some non-limiting examples of electronic systems include personal computers of all sizes and shapes, such as desktop computers, laptop computers, netbook computers, tablets, web browsers, e-book readers, personal digital assistants (PDAs) and multi-media entertainment devices of automobiles. Additional example electronic systems include composite input devices, such as physical keyboards that include input device 100 and separate joysticks or key switches. Further example electronic systems include peripherals such as data input devices, e.g., remote controllers and mice, and data output devices, e.g., display screens and printers. Other examples include remote terminals, kiosks, video game machines, e.g., video game consoles, portable gaming devices, multi-media entertainment devices of an automobile, and the like. Other examples include communication devices, e.g., cellular phones such as smart phones, and media devices, e.g., recorders, editors, and players such as televisions, set-top boxes, music players, digital photo frames, and digital cameras. Additionally, the electronic system could be a host or a slave to the input device. The electronic system may also be referred to as electronic device.

The input device 100 can be implemented as a physical part of the electronic system, or can be physically separate from the electronic system. In one embodiment, the electronic system may be referred to as a host device. As appropriate, the input device 100 may communicate with parts of the electronic system using any one or more of the following: buses, networks, and other wired or wireless interconnections. Examples include I$^2$C, SPI, PS/2, Universal Serial Bus (USB), Bluetooth, RF, and IRDA.

In FIG. 1, the input device 100 is shown as a proximity sensor device configured to sense input provided by one or more input objects 140 in a sensing region 120. Example input objects 140 include fingers and styli, as shown in FIG. 1. An exemplary proximity sensor device may be a touchpad, a touch screen, a touch sensor device and the like.

The sensing region 120 encompasses any space above, around, in and/or near the input device 100 in which the input device 100 is able to detect user input, e.g., user input provided by one or more input objects 140. The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiment's sense input that comprises: no contact with any surfaces of the input device 100; contact with an input surface, e.g., a touch surface, of the input device 100: contact with an input surface of the input device 100 coupled with some amount of applied force or pressure; and/or a combination thereof. In various embodiments, input surfaces may be provided by surfaces of casings within which the sensor electrodes (also referred to herein as sensing electrodes) reside, by face sheets applied over the sensor electrodes or any casings, etc. In some embodiments, the sensing region 120 has a rectangular shape when projected onto an input surface of the input device 100. An input object that is not in contact with any surfaces of the input device 100 may be referred to as a hovering input object.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images (e.g., of capacitive signals) that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self-capacitance" (also often referred to as "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage, e.g., system ground, and by detecting the capacitive coupling between the sensor electrodes and input objects. In some implementations sensing elements may be formed of a substantially transparent metal mesh (e.g., a reflective or absorbing metallic film patterned to minimize visible transmission loss from the display sub-pixels). Further, the sensor electrodes may be disposed over a display of a display device. The sensing electrodes may be formed on a common substrate of a display device (e.g., on the encapsulation layer of a rigid or flexible organic light emitting diode (OLED) display). An additional dielectric layer with vias for a jumper layer may also be formed of a substantially transparent metal mesh material (e.g., between the user input and an OLED cathode). The jumpers of the jumper layer may be coupled to the electrodes of a first group and cross over sensor electrodes of a second group.

Some capacitive implementations utilize "mutual capacitance" (also often referred to as "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also referred to herein as "transmitter electrodes" or "transmitters") and one or more receiver sensor electrodes (also referred to herein as "receiver electrodes" or "receivers"). The coupling may be reduced when an input object coupled to a system ground approaches the sensor electrodes. Transmitter sensor electrodes may be modulated relative to a reference voltage, e.g., system ground, to transmit transcapacitive sensing signals. Receiver sensor electrodes may be held substantially constant relative to the reference voltage or modulated relative to the transmitter sensor electrodes to facilitate receipt of resulting signals. A resulting signal may comprise effect(s) corresponding to one or more transcapacitive sensing signals, and/or to one or more sources of environmental interference, e.g., other electromagnetic signals. Sensor electrodes may be dedicated transmitters or receivers, or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) chips and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (in another embodiment, with associated firmware) separate from the central processing unit. As another example, the input device 100 may be physically integrated in a phone, and the processing system 110 may comprise circuits and firmware that are part of a main processor (e.g., a mobile device application processor or any other central processing unit) of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system, e.g., to a central processing system of the electronic system that is separate from the processing system 110, if such a separate central processing system exists. In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. The filtering may comprise one or more of demodulating, sampling, weighting, and accumulating of analog or digitally converted signals (e.g., for FIR digital or IIR switched capacitor filtering) at appropriate sensing times. The sensing times may be relative to the display output periods (e.g., display line update periods or blanking periods). As yet another example, the processing system 110 may subtract or otherwise account for a baseline, such that the information reflects a difference between the electrical signals from user input and the baseline signals. A baseline may account for display update signals (e.g., subpixel data signal, gate select and deselect signal, or emission control signal) which are spatially filtered (e.g., demodulated and accumulated) and removed from the lower spatial frequency sensing baseline. Further, a baseline may compensate for a capacitive coupling between the sensor electrodes and one or more nearby electrodes. The nearby electrodes may be display electrodes, dummy sensor electrodes, and or other conductive objects that may be capacitively coupled with the sensor electrodes. Additionally, the baseline may be compensated for using digital or analog means. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of a display screen. For example, the sensing region 120 may overlap at least a portion of an active area of a display screen (or display panel). The active area of the display panel may correspond to a portion of the display panel where images are updated. In one or more embodiments, the input device 100 may comprise substantially transparent sensor electrodes overlaying the display screen and provide a touch screen interface for the associated electronic system. The display panel may be any type of dynamic display capable of displaying a visual interface to a user, and may include any type of light emitting diode (LED), OLED, cathode ray tube (CRT), liquid crystal display (LCD), plasma, electroluminescence (EL), or other display technology. The input device 100 and the display panel may share physical elements. For example, some embodiments may utilize some of the same electrical components for displaying and sensing. As another example, the display panel may be operated in part or in total by the processing system 110.

It should be understood that while many embodiments of the disclosure are described in the context of a fully functioning apparatus, the mechanisms of the present disclosure are capable of being distributed as a program product, e.g., software, in a variety of forms. For example, the mechanisms of the present disclosure may be implemented and distributed as a software program on information bearing media that are readable by electronic processors, e.g., non-transitory computer-readable and/or recordable/writable information bearing media readable by the processing system 110. Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
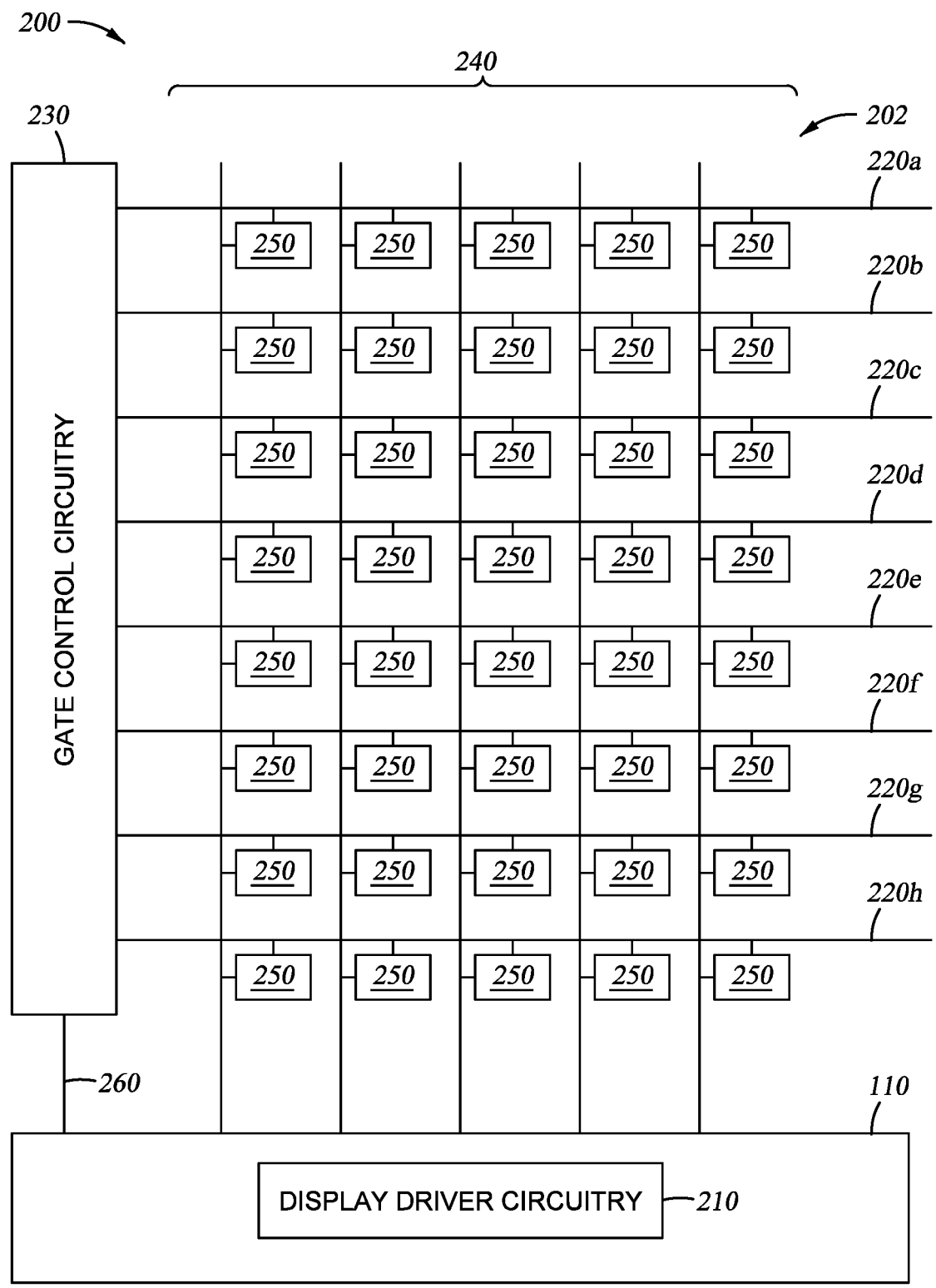
FIG. 2 is a schematic block diagram of an example display device, according to one or more embodiments.

FIG. 2 illustrates a display device 200, according to one or more embodiments. As illustrated, the display device 200 includes a display panel 202, a processing system 110, and gate control circuitry 230. The display device 200 further includes a gate control trace 260 coupled to the processing system 110 and the gate control circuitry 230. Further, in various embodiments, the processing system 110 may be referred to as a display driver. The display device 200 may be utilized in automotive applications. Alternatively, the display device 200 may be utilized in other applications.

The display panel 202 includes gate lines 220, data lines 240, and subpixels 250. Further, the processing system 110 is coupled with the data lines 240 of the display panel 202, and with the gate control circuitry 230 via the gate control trace 260.

In one embodiment, the gate lines 220 are coupled to one or more subpixels 250. The gate lines 220 may be driven with gate select signals to select the subpixels 250 for updating. For example, a gate line 220a may be driven with a gate select signal to select the subpixels 250 coupled to the gate line 220a for updating. In various embodiments, each gate line 220 is coupled to a respective row of the subpixels 250. In one or more embodiments, at least two gate lines 220 are coupled to the subpixels 250 of a common row. In one embodiment, each row of subpixels 250 may be referred to as a display line. Further, the period corresponding to when each subpixel 250 of a display line is updated may be referred to a display line update period.

Each of the data lines 240 may be coupled to a respective column of subpixels 250 and is configured to drive a subpixel data signal onto corresponding subpixels 250 to update the subpixels 250. For example, a subpixel 250 that has been selected for updating by the gate control circuitry 230 may be driven with a subpixel data signal by the display driver circuitry 210 via a corresponding one of the data lines 240.

In one or more embodiments, each subpixel 250 may include a subpixel electrode and subpixel circuitry comprising one or more transistors configured to control the activation and deactivation of each subpixel. The subpixel circuitry for each subpixel 250 may be coupled to a corresponding gate line 220, and a corresponding data line 240. In one embodiment, the subpixel circuitry couples a corresponding subpixel 250 with a subpixel data signal on a corresponding data line 240.

In one or more embodiments, the display device 200 may be a LCD device. In such embodiments, each of the subpixels 250 of the display device 200 includes subpixel electrodes which are driven relative to a common electrode or electrodes. For example, the display panel 202 may be one of an amorphous silicon (a-Si) display panel, a low temperature polysilicon (LTPS) display panel, and an indium gallium zinc oxide (IGZO) display panel, among others. In other embodiments, the display device 200 is an OLED display device. In such embodiments, the subpixels 250 may include anode electrodes which are driven relative to one or more cathode electrodes.

The processing system 110 may include display driver circuitry 210. In one embodiment, the processing system 110 is configured to receive display data from the host device for display updating. The processing system 110 may process the display data to generate subpixel update signals that are driven onto the data lines 240 to update the subpixels 250.

In one embodiment, the display driver circuitry 210 drives the data lines 240 with subpixel update signals to update the subpixels 250 selected by the gate control circuitry 230. For example, driving the subpixels 250 with the subpixel update drives the electrodes of the subpixels 250 to a particular voltage level.

In various embodiments, the processing system 110 may be configured to communicate with the gate control circuitry 230 via the gate control trace 260. In one embodiment, the display driver circuitry 210 communicates a gate select signal to the gate control circuitry 230. The gate select signal may indicate the voltage to drive on a gate line 220 to select or deselect a gate line 220 for display updating. In one embodiment, the display driver circuitry 210 is configured to communicate an indication of which gate line 220 to select for updating and/or an order to select the gate lines 220 for updating. In one or more embodiments, the display driver circuitry 210 is configured to transmit a clock signal to the gate control circuitry 230, and the gate control circuitry selects the gate lines 220 for updating based on rising edges of the clock signal.

The gate control circuitry 230 may be configured to drive a gate select signal on the gate lines 220 to select (active) and deselect (deactivate) the subpixels 250 for updating. In various embodiments, the gate control circuitry 230 may be referred to as a gate in panel (GIP) device, or a gate driver. Further, the gate select signal may be referred to as a gate control signal. The gate select signal may include a gate high signal, or $V_{GH}$, and a gate low signal, or $V_{GL}$. In one or more embodiments, $V_{GH}$ and $V_{GL}$ correspond to the turn-on and turn-off voltages of the select transistors of the subpixel circuitry of the subpixels 250. The select transistors are configured to control activation and deactivation of the subpixels 250. In one embodiment, when the gate select signal is set to $V_{GH}$, a corresponding gate line 220 may be selected for updating, and when the gate select signal is set to $V_{GL}$, a corresponding gate line may be deselected for updating. Alternatively, in various embodiments, $V_{GH}$ may correspond to a turn-off voltage of the select transistors and $V_{GL}$ may correspond to a turn-on voltage of the select transistors. In one embodiment, $V_{GH}$ is a positive voltage and $V_{GL}$ is a negative voltage. For example, $V_{GH}$ may be about 15 V and $V_{GL}$ may be about −10 V. However, in other embodiments, other voltages may be used.

The data lines 240 may be driven with corresponding subpixel data signals for updating the selected subpixels 250. In one embodiment, two or more of the data lines 240 are simultaneously driven with corresponding subpixel data signals. In one embodiment, the display driver circuitry 210 includes source drivers coupled to and configured to drive the data lines 240. In one embodiment, each source driver is coupled to a respective one of the data lines 240. In another embodiment, the source drives are coupled to multiplexers (MUXs), and then to the data lines 240. The source drivers of the display driver circuitry 210 may include one or more amplifiers and other driver circuitry configured to drive subpixel data signals onto the subpixels 250.

In one or more embodiments, the processing system 110 may additionally include hardware and/or firmware elements configured to receive display data from a host device and process the display data to generate the subpixel data signals. For example, the processing system 110 may include a mobile industry processor interface (MIPI) receiver. Further, the processing system 110 may include a timing control circuitry configured to generate timing signals used for display updating.

In one embodiment, the gate control circuitry 230 may be disposed within a common integrated circuit (IC) chip with the processing system 110. In other embodiments, the gate control circuitry 230 may be disposed within a first IC chip and the processing system 110 may be disposed within a second IC chip.

Figure 3:
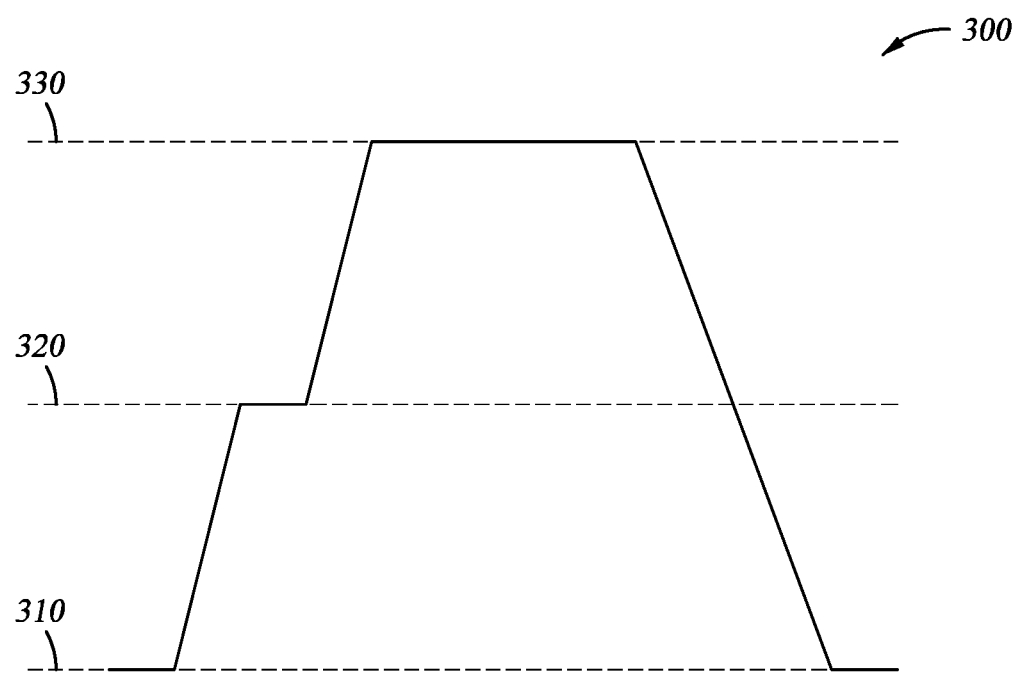
FIGS. 3, 4, 5, 6, 7, and 8 illustrate example gate select signals, according to one or more embodiments.

FIG. 3 illustrates a gate select signal 300, according to one or more embodiments. The gate select signal 300 includes three different voltages. Each of the voltages is a direct current (DC) voltage. Further, the gate select signal 300 is a multi-step waveform comprising multiple DC levels (e.g., voltages). As depicted in FIG. 3, the gate select signal 300 transitions from voltage 310 to voltage 320 and from the voltage 320 to a voltage 330. The voltage value of the voltage 320 is greater than the voltage value of the voltage 310. Further, the voltage value of the voltage 320 is less than the voltage value of the voltage 330.

In various embodiments, utilizing a multi-step waveform increases the number of harmonics of the gate select signal 300 as the increased number of voltage levels, or steps, alters the rise time of the rising edge and/or the fall time of the falling edge of the gate select signal 300. Further, increasing the number of harmonics redistributes the power of the peaks of the electromagnetic interference (EMI) spectrum of the gate select signal 300 over the frequencies of the additional harmonics. Thus, reducing the power of the peaks in the EMI spectrum. In various embodiments, reducing the power of the peaks in the EMI spectrum reduces interference that may interfere with nearby electronic devices. In one or more embodiments, the electronic devices may be utilized within automotive applications having corresponding interference regulation requirements. In such embodiments, utilizing a multi-step gate select signal, e.g., the gate select signal 300, reduces the power of the peaks in the EMI spectrum of the gate select signal. Accordingly, a corresponding display device, e.g., display device 200, is able to satisfy the interference regulation requirements and is useable in such automotive applications.

In one embodiment, reducing the power of the peaks of the EMI spectrum reduces interference that may interfere with electronic devices such as amplitude modulation (AM) radio devices and/or frequency modulation (FM) radio devices of an automobile. In various embodiments, increasing the number of voltage levels, or steps, within gate select signal 300 may further reduce the power of the peaks of the EMI spectrum generated by the gate select signal 300, further reducing the interference generated by the gate select signal 300.

In one or more embodiments, utilizing a multi-step waveform approximates the slew rate control of a gate select signal, e.g., the gate select signal 300. Additionally, the use of a multi-step waveform approximates slew rate control of a gate select signal at a lower design and hardware cost and smaller circuit size as compared to the use of dedicated analog slew rate control circuitry.

In one embodiment, the voltage 310 may be $V_{GL}$ and the voltage 330 may be $V_{GH}$. Further, the voltage 320 may be any voltage having a voltage value between the voltage 310 and the voltage 330.

In one embodiment, the voltage 320 may be a power supply voltage of the display device 200. For example, the power supply voltage may be a system ground voltage, a voltage supply negative voltage ($V_{SN}$), a voltage supply positive voltage ($V_{SP}$), an input/output interface voltage, a logic circuit voltage, and a digital power supply voltage, among others. Further, the voltage 320 may be any other power supply voltage between $V_{GL}$ and $V_{GH}$ available within or generated by the display device 200.

In various embodiments, the voltage 320 is a power supply voltage which is a regulated voltage. For example, the regulated voltage may be a voltage regulated by the processing system 110, the display driver circuitry 210, or the gate control circuitry 230 of the display device 200. The processing system 110, the display driver circuitry 210, and/or the gate control circuitry 230 may comprise one or more voltage regulators configured to generate the regulated voltage or voltages supplied to and used by the processing system 110, the display driver circuitry 210, the gate control circuitry 230, and/or other elements of the display device 200. Any of the above examples such as the system ground voltage, $V_{SN}$, $V_{SP}$, the input/output interface voltage, the logic circuit voltage, and the digital power supply voltage may be a regulated voltage.

In one or more embodiments, a power supply voltage is generated external to the processing system 110. For example, a power supply voltage may be generated by a host device coupled to the display device 200.

In one or more embodiments, the voltage supply negative voltage $V_{SN}$ and the voltage supply positive voltage $V_{SP}$ are a negative voltage source voltage and a positive voltage source voltage of the display driver circuitry 210, respectively. In such embodiments $V_{SN}$ and $V_{SP}$ may be utilized to generate the output voltage of a source amplifier circuit of the display driver circuitry 210.

In various embodiments, utilizing a multi-step waveform for the gate select signal 300 varies one or more of the rise time and the fall time of the gate select signal. In various embodiments, adding the voltage 320 between the voltage 310 and the voltage 330 increases the rise time of the rising edge of the gate select signal 300. Further, adding a voltage between the voltage 330 and the voltage 310 increases the fall time of the falling edge of the gate select signal 300. In various embodiments, varying the length of the period that a voltage between the voltage 310 and the voltage 330 is driven alters the rise time of the rising edge of the gate select signal 300. For example, increasing the length of the period that the voltage 320 is driven increases the rise time of the rising edge of the gate select signal 300. Further, varying the length of the period that a voltage between voltage 330 and voltage 310 is driven may alter the fall time of the falling edge of the gate select signal 300.

Figure 4:
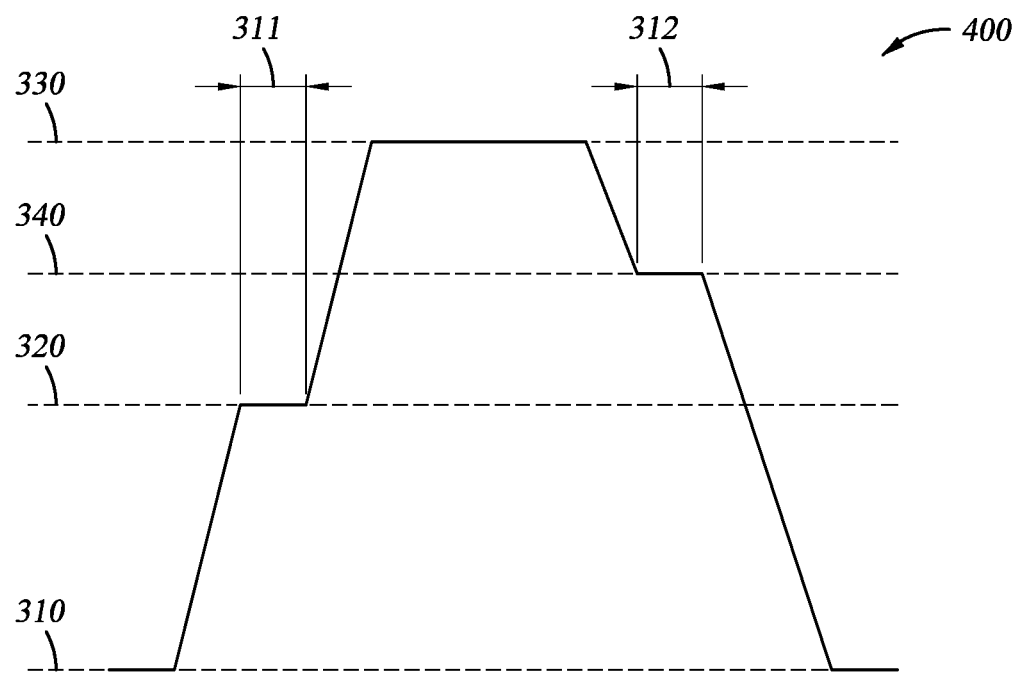

FIG. 4 illustrates a gate select signal 400, according to one or more embodiments. The gate select signal 400 is a multi-step waveform including four different voltages. For example, the gate select signal 400 includes a transition from the voltage 310 to the voltage 320, from the voltage 320 to the voltage 330, from the voltage 330 to the voltage 340 and from the voltage 340 to the voltage 310. The voltage value of the voltage 310 is less than the voltage value of the voltage 320, and the voltage value of the voltage 320 is less than the voltage value of the voltage 330. Further, the voltage value of the voltage 330 is greater than the voltage value of the voltage 340 and the voltage value of the voltage 340 is greater than the voltage value of the voltage 310. In one embodiment, the voltage value of the voltage 320 differs from the voltage value of the voltage 340. For example, the voltage value of the voltage 320 may be greater than or less than the voltage value of the voltage 340. In various embodiments, the voltage value of the voltage 320 may be the same as voltage value of the voltage 340.

In one embodiment, the voltage 320 is driven during period 311 and the voltage 340 is driven during period 312. The length of the period 311 and the length of the period 312 may be the same. Alternatively, the length of the period 311 may be longer than or shorter than length of the period 312.

In one embodiment, the voltage 310 may be $V_{GL}$ and the voltage 330 may be $V_{GH}$. Further, the voltages 320 and 340 may be any voltages having a value between $V_{GL}$ and $V_{GH}$. For example, the voltages 320 and 340 may be one of system ground, $V_{SN}$, $V_{SP}$, or other power supply voltages of the display device 200 as are described in greater detail above.

As compared to the rise time of the rising edge and/or fall time of the falling edge of the gate select signal 300, the rise time of the rising edge and/or the fall time of the of the falling edge of the gate select signal 400 may differ. For example, the rise time of the rising edge and/or fall time of the falling edge of the gate select signal 400 may be greater than that of the gate select signal 300. In one embodiment, by varying the length of the period 311, the rise time of the rising edge of the gate select signal 400 is varied. For example, increasing the length of the period 311 may increase the rise time of the rising edge and decreasing the length of the period 311 may decrease the rise time of the rising edge. Further, by varying the length of the period 312, the fall time of the falling edge of the gate select signal 400 may be varied. For example, increasing the length of the period 312 may increase the fall time of the falling edge and decreasing the length of the period 312 may decrease the fall time of the falling edge.

Figure 5:
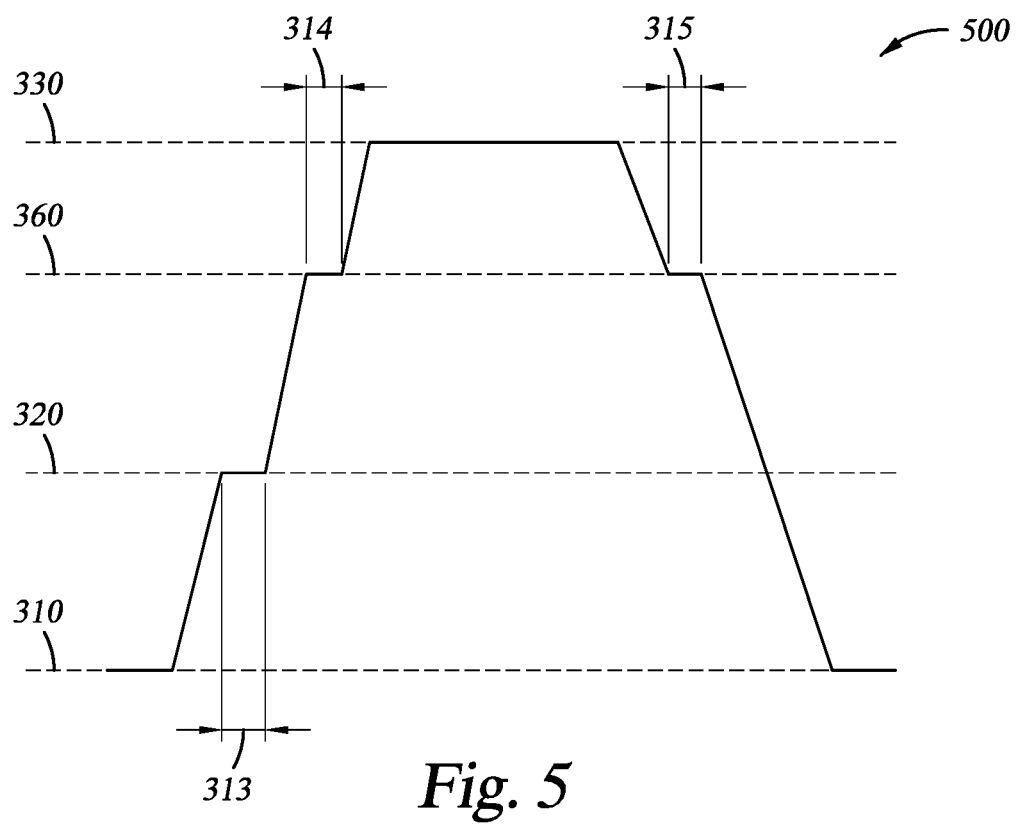

FIG. 5 illustrates a gate select signal 500, according to one or more embodiments. The gate select signal 500 is a multi-step waveform including four different voltages and five voltage transitions. For example, the gate select signal 500 includes a transition from the voltage 310 to the voltage 320, from the voltage 320 to the voltage 360, and from the voltage 360 to the voltage 330. Further, the gate select signal 500 includes a transition from the voltage 330 to the voltage 360 and from the voltage 360 to the voltage 310. The voltage value of the voltage 320 is less than the voltage value of the voltage 360.

In one embodiment, the voltage 320 is driven during period 313 and the voltage 360 is driven during periods 314 and 315. The length of at least two of the periods 313, 314, and 315 may be the same. Further, the length of the period 313 may be longer than or shorter than length of periods 314 and/or 315. Alternatively, the length of the period 314 may be longer than or shorter than the length of the periods 313 and/or 315. Further, the length of the period 315 may be longer than or shorter than the length of the periods 313 and/or 314.

In one embodiment, the voltage 310 is $V_{GL}$ and the voltage 330 is $V_{GH}$. Further, the voltages 320 and 360 may be any voltages having a value between $V_{GL}$ and $V_{GH}$. For example, the voltages 320 and 360 may be one of system ground, $V_{SN}$, $V_{SP}$, or other power supply voltages of the display device 200 as are described in greater detail above.

In one or more embodiments, varying the length of the period 313 and/or the period 314 varies the rise time of the rising edge of the gate select signal 500. For example, increasing the length of the period 313 and/or the period 314 may increase the rise time of the rising edge. Further, decreasing the length of the period 313 and/or the period 314 may decrease the rise time of the rising edge. Further, by varying the length of the period 315, the fall time of the falling edge of the gate select signal 500 may be varied. For example, increasing the length of the period 315 may increase the fall time of the falling edge. Further, decreasing the length of the period 315 may decrease the fall time of the falling edge.

Figure 6:
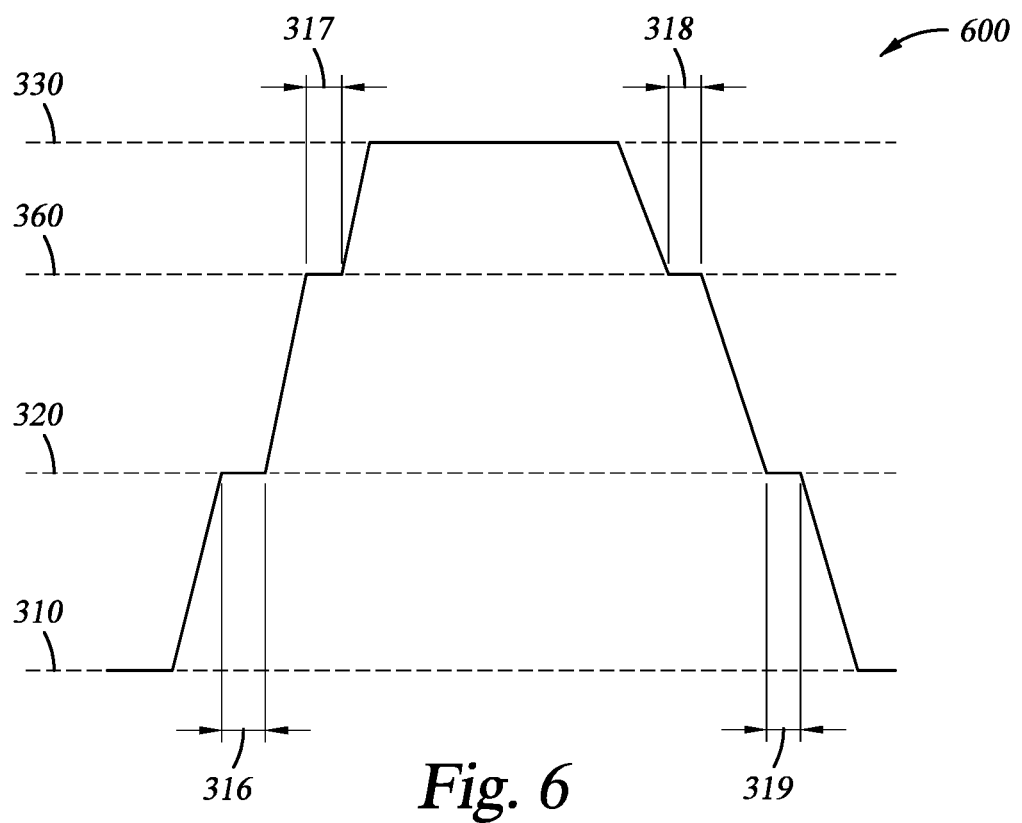

FIG. 6 illustrates a gate select signal 600, according to one or more embodiments. The gate select signal 600 is a multi-step waveform including four different voltages and six voltage transitions. For example, the gate select signal 600 includes a transition from the voltage 310 to the voltage 320, from the voltage 320 to the voltage 360, and from the voltage 360 to the voltage 330. Further, the gate select signal 600 transitions from the voltage 330 to the voltage 360 and from the voltage 360 to the voltage 320 and from the voltage 320 to the voltage 310. In various embodiments, the gate select signal 600 may be referred to as having symmetric steps as both the rising edge and falling edge of the gate select signal 600 have common voltage levels (e.g., steps).

In one embodiment, the voltage 320 is driven during periods 316 and 319, and the voltage 360 is driven during periods 317 and 318. The length of at least two of the periods 316, 317, 318 and 319 may be the same. Further, the length of the period 316 may be longer than or shorter than the length of one or more of the periods 317, 318 and 319. Further, the length of the period 317 may be longer than or shorter than the length of one or more of the periods 316, 318 and 319. In one or more embodiments, the length of the period 318 may be longer than or shorter than the length of one or more of the periods 316, 317 and 319. In various embodiments, the length of the period 319 may be longer than or shorter than the length of one or more of the periods 316, 317 and 318.

In one embodiment, the voltage 310 is $V_{GL}$ and the voltage 330 is $V_{GH}$. Further, the voltages 320 and 360 may be any voltages having a value between $V_{GL}$ and $V_{GH}$. For example, the voltages 320 and 360 may be one of system ground, $V_{SN}$, $V_{SP}$, or other power supply voltages of the display device 200.

In one or more embodiments, varying the length of the period 316 and/or the period 317 varies the rise time of the rising edge of the gate select signal 600. For example, increasing the length of the period 316 and/or the period 317 may increase the rise time of the rising edge. Further, decreasing the length of the period 316 and/or the period 317 may decrease the rise time of the rising edge. Further, by varying the length of the period 318 and/or the period 319, the fall time of the falling edge of the gate select signal 600 may be varied. For example, increasing the length of the period 318 and/or the period 319 may increase the fall time of the falling edge. Further, decreasing the length of the period 318 and/or the period 319 may decrease the fall time of the falling edge.

Figure 7:
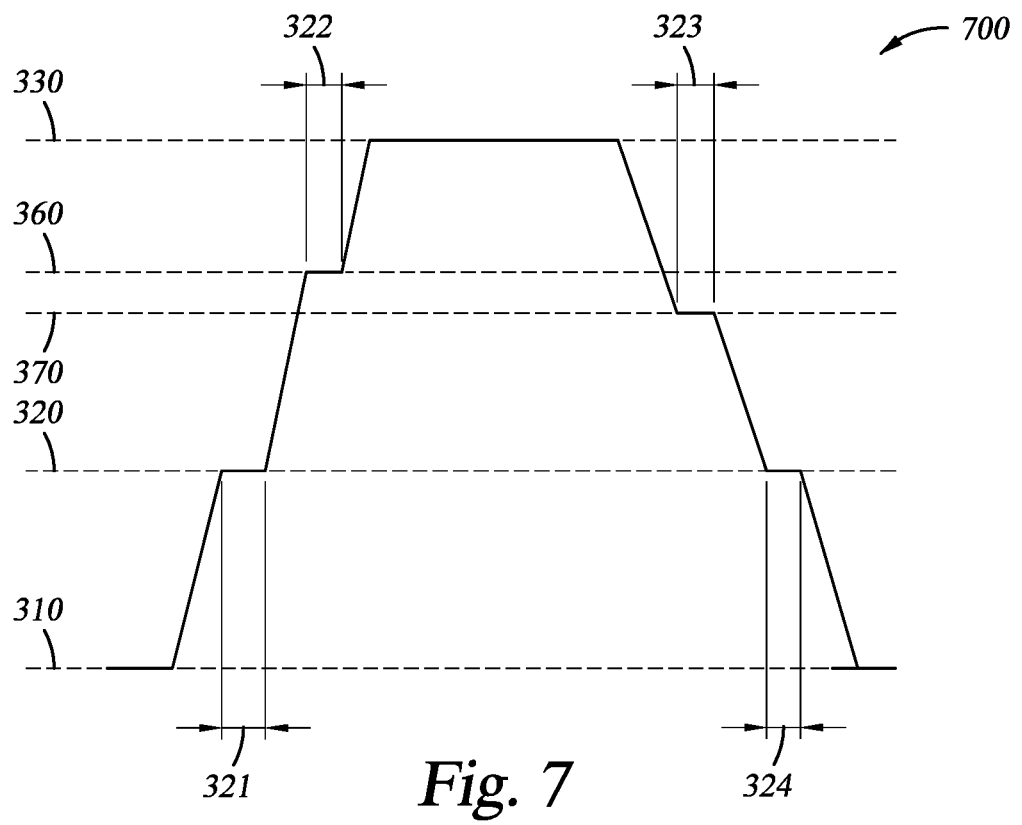

FIG. 7 illustrates a gate select signal 700, according to one or more embodiments. The gate select signal 700 is a multi-step waveform including five different voltages and six voltage transitions. For example, the gate select signal 700 includes a transition from the voltage 310 to the voltage 320, from the voltage 320 to the voltage 360, and from the voltage 360 to the voltage 330. Further, the gate select signal 700 transitions from the voltage 330 to the voltage 370 and from the voltage 370 to the voltage 320 and from the voltage 320 to the voltage 310.

In one embodiment, the voltage value of voltage 320 may be less than the voltage value of the voltage 360 and less than the voltage value of the voltage 370. Further, the voltage 360 may be greater than the voltage 370 or less than the voltage 370.

In one embodiment, the voltage 310 is $V_{GL}$ and the voltage 330 is $V_{GH}$. Further, the voltages 320, 360 and 370 may be any voltage having a value between $V_{GL}$ and $V_{GH}$. For example, the voltages 320, 360, and 370 may be one of system ground, $V_{SN}$, $V_{SP}$, or other power supply voltages of the display device 200 as are described in greater detail above.

In one embodiment, the voltage 320 is driven during periods 321 and 324, the voltage 360 is driven during period 322, and the voltage 370 is driven during period 323. The length of at least two of the periods 321, 322, 323 and 324 may be the same. Further, the length of the period 321 may be longer than or shorter than the length of one or more of the periods 322, 323 and 324. Further, the length of the period 322 may be longer than or shorter than the length of one or more of the periods 321, 323 and 324. In one or more embodiments, the length of the period 323 may be longer than or shorter than the length of one or more of the periods 321, 322 and 324. In one embodiment, the length of the period 324 may be longer than or shorter than the length of one or more of the periods 321, 322 and 323.

In one or more embodiments, varying the length of the period 321 and/or the period 322 varies the rise time of the rising edge of the gate select signal 700. For example, increasing the length of the period 321 and/or the period 322 may increase the rise time of the rising edge. Additionally, decreasing the length of the period 321 and/or the period 322 may decrease the rise time of the rising edge. Further, by varying the length of the period 323 and/or the period 324, the fall time of the falling edge of the gate select signal 700 may be varied. For example, increasing the length of the period 323 and/or the period 324 may increase the fall time of the falling edge. Additionally, decreasing the length of the period 323 and/or the period 324 may decrease the fall time of the falling edge.

Figure 8:
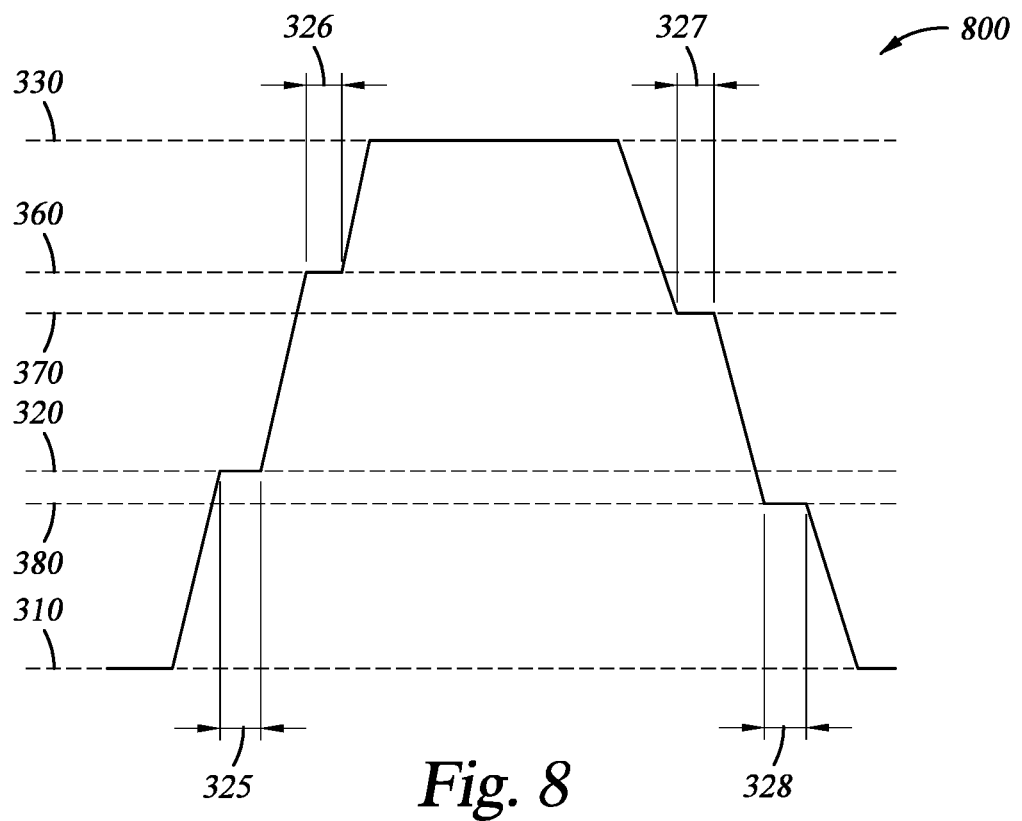

FIG. 8 illustrates a gate select signal 800, according to one or more embodiments. The gate select signal 800 is a multi-step waveform including six different voltages and six voltage transitions. For example, the gate select signal 800 includes a transition from the voltage 310 to the voltage 320, from the voltage 320 to the voltage 360, and from the voltage 360 to the voltage 330. Further, the gate select signal 800 includes a transition from the voltage 330 to the voltage 370 and from the voltage 370 to the voltage 380 and from the voltage 380 to the voltage 310.

In one embodiment, the voltage value of voltage 320 may be less than the voltage value of the voltage 360 and less than the voltage value of the voltage 370, and less than or greater than the voltage value of the voltage 380. Further, the voltage 360 may be greater than the voltage 370 or less than the voltage 370. In various embodiments, the voltage 380 may be less than the voltages 320, 360 and 370. In one embodiment, the voltage 320 is less than the voltage 360 and greater than the voltages 370 and 380. In another embodiment, the voltage 380 is less than the voltage 370 and greater than the voltages 320 and 360.

In one embodiment, the voltage 310 is $V_{GL}$ and the voltage 330 is $V_{GH}$. Further, the voltages 320, 360, 370 and 380 may be any voltage having a value between $V_{GL}$ and $V_{GH}$. For example, the voltages 320, 360, 370 and 380 may be one of system ground, $V_{SN}$, $V_{SP}$, or other power supply voltages of the display device 200 as are described in greater detail above.

In one embodiment, the voltage 320 is driven during period 325, the voltage 360 is driven during period 326, the voltage 370 is driven during period 327, and the voltage 380 is driven during period 328. The length of at least two of the periods 325, 326, 327 and 328 may be the same. Further, the length of the period 325 may be longer than or shorter the length of one or more of the periods 326, 327 and 328. The length of the period 326 may be longer than or shorter than the length of one or more of the periods 325, 327 and 328. Alternatively, the length of the period 327 may be longer than or shorter than the length of one or more of the periods 325, 326 and 328. Further, the length of the period 328 may be longer than or shorter than the length of one or more of the periods 325, 326 and 327.

In one or more embodiments, varying the length of the period 325 and/or the period 326 varies the rise time of the rising edge of the gate select signal 800. For example, increasing the length of the period 325 and/or the period 326 may increase the rise time of the rising edge. Additionally, decreasing the length of the period 325 and/or the period 326 may decrease the rise time of the rising edge. Further, by varying the length of the period 327 and/or the period 328, the fall time of the falling edge of the gate select signal 800 may be varied. For example, increasing the length of the period 327 and/or the period 328 may increase the fall time of the falling edge. Additionally, decreasing the length of the period 327 and/or period 328 may decrease the fall time of the falling edge.

In various embodiments, the duty cycle of a gate select signal formed from a multi-step waveform (e.g., the gate select signal 300) is similar to that of a gate select signal not formed from a multi-step waveform. For example, the duty cycle of the gate select signals 300, 400, 500, 600, 700 and 800 may at least similar to that of a gate select signal not formed from a multi-step waveform.

Figure 9:
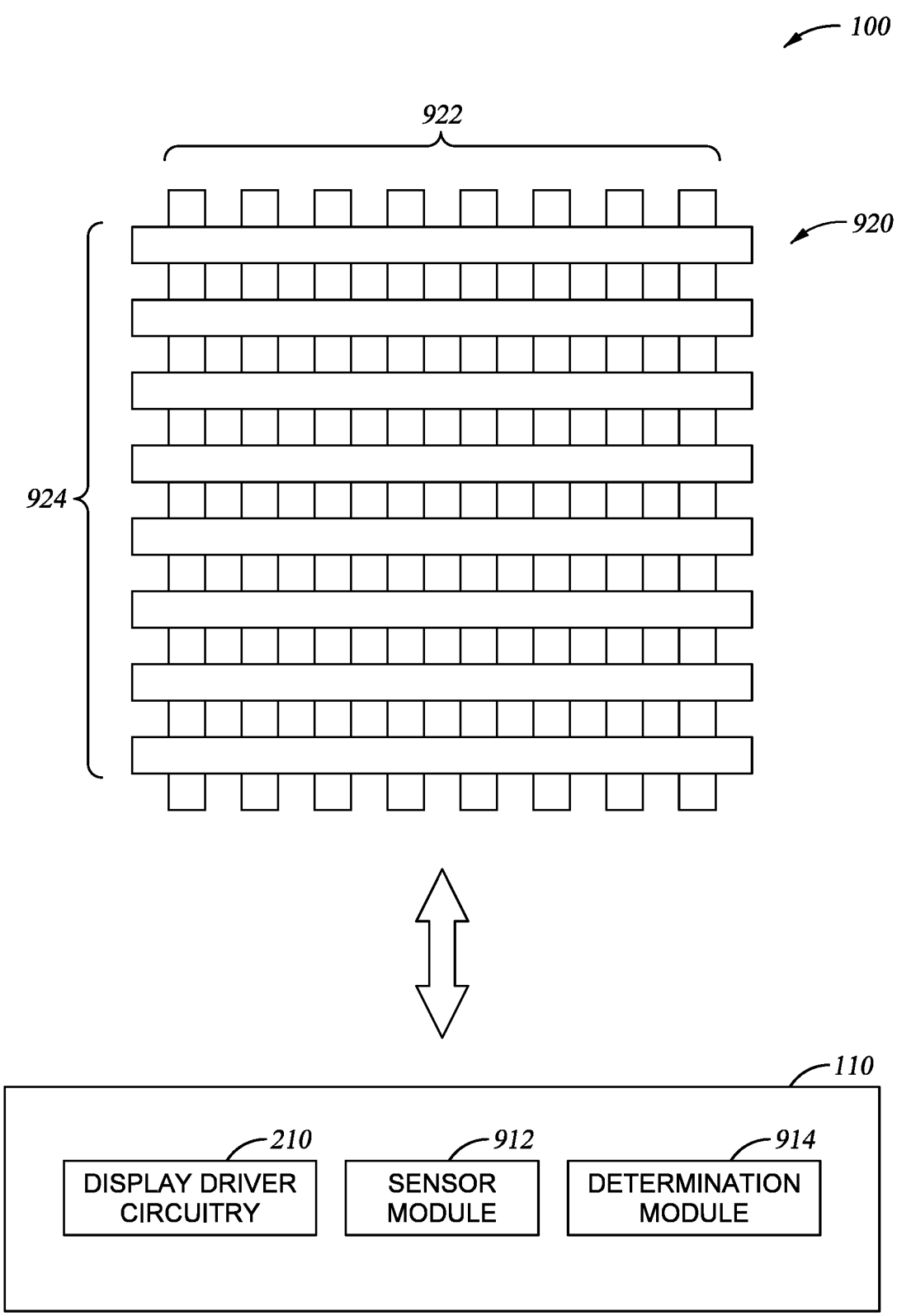
FIG. 9 illustrates an example input device, according to one or more embodiments.

FIG. 9 illustrates input device 100, according to one or more embodiments. The input device 100 includes sensor electrodes 920 which are coupled to processing system 110. The sensor electrodes 920 include sensor electrodes 922 and sensor electrodes 924. In one embodiment, the sensor electrodes 922 are disposed on a first layer and the sensor electrodes 924 are disposed on a second layer. For example, the sensor electrodes 922 maybe disposed on a first substrate and the sensor electrodes 924 maybe disposed on a second substrate. Further, the sensor electrodes 922 may be disposed on a first side of a first substrate and the sensor electrodes 924 may be disposed on a second side of the first substrate. In one or more embodiments, the sensor electrodes 922 and the sensor electrodes 924 may be disposed on a common side of a substrate. In such embodiments, the sensor electrodes 922 and the sensor electrodes 924 may be non-overlapping or may be overlapping, and one of the sensor electrodes 922 and the sensor electrodes 924 includes jumpers in the overlapping regions that isolate the sensor electrodes 922 from the sensor electrodes 924.

The sensor electrodes 920 may have any shape, size and/or orientation. For example, the sensor electrodes 920 may be arranged in a two-dimensional array as illustrated in FIG. 9. Alternatively, the sensor electrodes 920 may be arranged as a matrix of non-overlapping sensor electrodes.

Each of the sensor electrodes 920 may be substantially rectangular in shape. In other embodiments, the sensor electrodes 920 may have other shapes. Further, each of the sensor electrodes 920 may have the same shape and/or size. In other embodiments, at least one sensor electrode may have a different shape and/or size than another sensor electrode. In various embodiments, the sensor electrodes 920 may be diamond shaped, have interdigitated fingers to increase field coupling, and/or have floating cut-outs inside to reduce stray capacitance to nearby electrical conductors.

The sensor module 912 may include hardware and firmware elements configured to drive the sensor electrodes 920 to acquire sensor data. For example, the sensor module 912 may include receiver circuitry configured to receive resulting signals from one or more of the sensor electrodes 920. The receiver circuitry may include analog front ends (AFEs) configured to receive resulting signals from one or more of the sensor electrodes 920. Additionally, the sensor module 912 may include transmitter circuitry configured to drive sensing signals onto one or more of the sensor electrodes 920. The transmitter circuitry may include one or more amplifiers configured to drive sensing signals onto one or more of the sensor electrodes 920. The amplifiers may correspond to one or more buffers or modulators. The sensing signals may include transcapacitive sensing signals for transcapacitive sensing and absolute capacitive sensing signals for absolute capacitive sensing. In one embodiment, the sensor module 912 is configured to operate the sensor electrodes 920 for absolute capacitive sensing by driving one or more of the sensor electrodes 920 with absolute capacitive sensing signals while receiving resulting signals with the driven sensor electrodes. Further, the sensor module 912 may be configured to operate the sensor electrodes 920 for transcapacitive sensing by driving one or more of the sensor electrodes 920 with a transcapacitive sensing signal and receiving resulting signal from another one or more of the sensor electrodes 920. The sensor electrodes 920 driven with the transcapacitive sensing signal may be referred to as a transmitter electrode and the sensor electrodes 920 operated to receive resulting signals may be referred to as a receiver electrodes.

In one embodiment, the sensing signals may be varying voltage signals that vary between at least two voltages. Further, the sensing signals may include a plurality of sensing bursts. In various embodiments, each sensing burst may include a plurality of voltage transitions. In one or more embodiments, the sensor module 912 may maintain the receiver electrodes at a substantially constant voltage (e.g., relative to system ground) or modulate the receiver electrodes relative to the transmitter electrodes. In one embodiment, when the receiver electrodes are modulated (e.g., relative to system ground), the transmitter electrodes are modulated relative to the receiver electrodes, such that the transmitter electrodes are modulated at a different phase, polarity, amplitude, and/or frequency than the receiver electrodes. In one or more embodiments, the sensor module 912 receives resulting signals with the receiver electrodes and the determination module 914 measures the resulting signals to determine a measurement of the change in capacitive coupling between the receiver electrodes and the transmitter electrodes.

The sensor module 912 may be configured to drive each of the transmitter electrodes one at a time, or simultaneously drive at least two of the transmitter electrodes. In one embodiment, the sensor module 912 is configured to simultaneously drive at least two transmitter electrodes with different transcapacitive sensing signals based on different codes or frequencies. For example, multiple transmitter electrodes may be simultaneously driven with transcapacitive sensing signals which are modulated with substantially orthogonal coded sequences (e.g., amplitude shifted, phase shifted, frequency shifted). The corresponding resulting signals may be decoded by the determination module 914 to independently determine the change in capacitive coupling between the transmitter electrodes and the receiver electrodes.

In various embodiments, the sensor electrodes 920 are operated for absolute capacitive sensing by the sensor module 912. In such an embodiment each of the sensor electrodes 920 may be modulated relative to a reference voltage (e.g., system or device ground) with an absolute capacitive sensing signal by the sensor module 912 such that the sensor module 912 receives resulting signals from the modulated sensor electrodes. The determination module 914 may be configured to determine changes in a capacitive coupling between the modulated sensor electrode and an input object, such as input object 140, from the resulting signals. In one embodiment, all of the sensor electrodes 920 may be simultaneously operated for absolute capacitive sensing, such that a different resulting signal is simultaneously received from each of the sensor electrodes or a common resulting signal from two or more sensor senor electrodes. In another embodiment, the sensor electrodes 922 may be operated for absolute capacitive sensing during a first period and the sensor electrodes 924 may be operated for absolute capacitive sensing during a second period that is non-overlapping with the first period.

The areas of localized capacitive sensing of capacitive couplings may be termed "capacitive pixels." The capacitive pixels may be formed between individual sensor electrodes of the sensor electrodes 920 and a reference voltage in embodiments employing absolute capacitive sensing methods and between groups of sensor electrodes 920 used as transmitter and receiver electrodes in embodiments employing transcapacitive sensing methods. For example, in an embodiment employing absolute capacitive sensing, the capacitive pixels may be formed between where parallel fields from the input object 140 couple to system ground of the input device 100. Further, in embodiments employing transcapacitive sensing method, the capacitive pixels may be formed where fringing fields of a first sensor electrode couple to a neighboring sensor electrode most strongly. In various embodiments, a set of measurements between the sensor electrodes 920 or between the sensor electrodes 920 and an input object may be utilized by the determination module 914 to form the capacitive pixels of a "capacitive image" or points along one or more capacitive profiles or projections. In one embodiment, the determination module 914 is configured to determine one or more capacitive images and transcapacitive profiles along the sensor electrodes 922 and 924 based on the measurements of the change in capacitive coupling between the sensor electrodes.

In some touch screen embodiments, one or more of the sensor electrodes 920 comprise one or more display electrodes used in updating the display of the display device 200. In one or more embodiments, the display electrodes comprise one or more segments of a Vcom electrode (common electrodes), a data line 240, gate line 220, an anode electrode, a cathode electrode, or any other display element. In one embodiment, the common electrodes may be disposed on the transparent substrate (a glass substrate, TFT glass, or any other transparent material) in some display panels (e.g., IPS, Plane to Line Switching (PLS), or an OLED), on the bottom of the color filter glass of some display panels (e.g., Patterned Vertical Alignment (PVA) or Multi-domain Vertical Alignment (MVA)), over or under an emissive layer of an OLED, etc. In one or more embodiments, the electrode or electrodes may be utilized for both capacitive sensing and display updating and may be referred to as a "combination electrode", since it performs multiple functions.

In various embodiments, the common electrode may be segmented to form a plurality of common electrodes and each of the sensor electrodes 920 comprises one or more common electrodes. For example, each of the sensor electrodes 922 and 924 may comprise a respective one or more common electrode. In such embodiments, the input device 100 may be referred as a "Full InCell" input device as all of the sensor electrodes 922 and 924 comprise a respective one or more common electrode. Alternatively, in one or more embodiments, each the sensor electrodes 922 comprises a respective one or more common electrode and each of the sensor electrodes 924 comprise electrodes that are separate from the common electrodes. For example, each of the sensor electrodes 924 may be disposed between the common electrodes and an input surface of the input device 100. In one or more embodiments, each of the sensor electrodes 924 comprises a respective one or more common electrode and the sensor electrodes 922 comprise electrodes that are separate from the common electrodes. In such embodiments, the input device 100 may be referred to as a "Hybrid InCell" device as one of the sensor electrodes 922 and 924 comprises a respective one or more common electrode and the other of the sensor electrodes 922 and 924 comprises electrodes that are separate from the common electrodes.

The sensor electrodes 920 may be operated for capacitive sensing during a capacitive frame. For example, during a capacitive frame the sensor electrodes 920 may be operated for transcapacitive sensing and/or absolute capacitive sensing to determine the positional information of one or more input objects.

In one embodiment, a capacitive frame rate (or sensing rate) corresponds to how often a capacitive frame is completed. For example, a capacitive frame may be acquired once every 16 ms, generating a capacitive frame rate of 60 Hz. In other embodiments, the capacitive frame rate may be about 90 Hz, 120 Hz, 240 Hz, or greater. Further, in one or more embodiment, the capacitive frame rate may be less than 60 Hz (e.g., for low power sensing).

Multiple capacitive frames may be acquired over multiple time periods, and differences between them used to derive information about input in the sensing region. For example, successive capacitive frames acquired over successive periods can be used to track the motion(s) of one or more input objects entering, exiting, and within the sensing region, or alternately report an input object hovering (e.g., proximate to, but not in contact with an input surface of the input device 100), touching (e.g., in contact with an input surface of the input device 100), pressing on the input surface of the input device or lifting from a the input surface of the input device 100 for various GUI implementations.

In one or more embodiments, capacitive sensing (or input sensing) and display updating may occur during at least partially overlapping periods. For example, as a display panel is driven for display updating, the sensor electrodes 920 may also be driven for capacitive sensing. In another embodiment, capacitive sensing and display updating may occur during non-overlapping periods, also referred to as non-display update periods. In one such embodiment, the non-display blanking period may be between the last line of a display frame and the first line of the following display frame (e.g., during a vertical blanking period).

In various embodiments, the non-display update periods may occur between display line update periods for two consecutive display lines of a display frame and may be at least as long in time as the display line update period. In such embodiments, the non-display update period may be referred to as a long horizontal blanking period, long h-blanking period or a distributed blanking period, where the blanking period occurs between two display updating periods within a frame and is at least as long as a display line update period. In one embodiment, the non-display update period occurs between display line update periods of a frame and is long enough to allow for multiple transitions of the transcapacitive sensing signal to be driven onto the sensor electrodes to be sampled and filtered. In other embodiments, the non-display update period may comprise horizontal blanking periods and vertical blanking periods. Further, the combination of horizontal blanking periods and vertical blanking periods present in the non-display update period or periods may depend on the a selected interference level and selected report rate for the measurement. Further, the types of input sensing performed may be used to determine the combination of horizontal blanking periods and vertical blanking periods present in the non-display update period or periods. For example, hover sensing may be performed between display frames and touch detection may be performed during display frames.

In one or more embodiments, one or more of the voltages 320, 340, 360, 370, and 380 of FIGS. 3-8 may be a power supply voltage of the input device 100. For example, one or more of the voltages 320, 340, 360, 370, and 380 may be a power supply voltage generated by or utilized by the sensor module 912. Further, one or more of the voltages 320, 340, 360, 370, and 380 may be a power supply voltage utilized during input sensing performed by the processing system 110.

Figure 10:
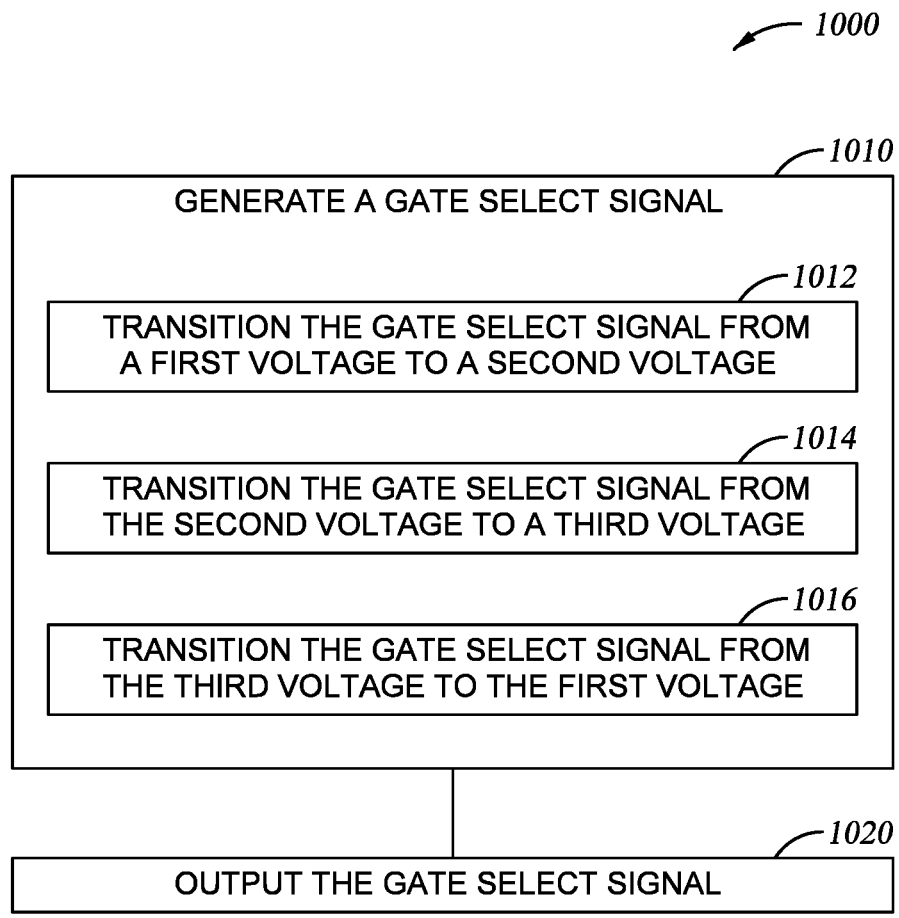
FIG. 10 illustrates a flowchart of a method for generating a gate select signal, according to one or more embodiments.

FIG. 10 is a flow chart of a method 1000 for generating a gate select signal, according to one or more embodiments. The method 1000 includes operation 1010, generating a gate select signal. The gate select signal may be a multi-step waveform. In various embodiments, the gate select signal may be any one of gate select signals 300-800. In one embodiment, the display driver circuitry 210 generates the gate select signal by transitioning the gate select signal from a first voltage to a second voltage, operation 1012. The voltage value of the first voltage is less than the voltage value of the second voltage. Further, at operation 1014, the display driver circuitry 210 transitions the gate select signal from the second voltage to a third voltage to generate the gate select signal. The voltage value of the second voltage is less than the voltage value of the third voltage. At operation 1016, the display driver circuitry 210 transitions the gate select signal from the third voltage to the first voltage to generate the gate select signal. In one embodiment, generating the gate select signal may further include transitioning from the second voltage to a fourth voltage having a voltage value greater than the voltage value of the second voltage. In various embodiments, generating the gate select signal may comprise additional transitions between the fourth voltage and the second voltage. Further, in other embodiment, generating the gate select signal comprises one or more additional voltage transitions between the third voltage and the first voltage.

At operation 1020, the gate select signal is outputted. For example, the display driver circuitry 210 outputs the gate select signal to the gate control circuitry 230. The gate control circuitry 230 may drive the gate select signal onto the gate lines 220 to select one of the gate lines 220 for updating. The gate control circuitry 230 may drive the gate select signal onto each of the gate lines 220 during non-overlapping or at least partially overlapping periods to select the gate lines 220 for updating. In one embodiment, the gate control circuitry 230 may drive the gate select signal onto the gate line 220a during a first period to select the subpixels 250 coupled to the gate line 220a for updating, and onto gate line 220b during a second period to select the subpixels 250 coupled to the gate line 220b for updating. The first and second periods may be non-overlapping or at least partially overlapping.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

What is claimed is:

1. A processing system comprising:
   driver circuitry configured to:
      generate a gate select signal comprising a rising edge and a falling edge, wherein one or both of the rising edge and the falling edge comprises at least three voltage transitions; and
      output the gate select signal to gate control circuitry configured to drive the gate select signal on a gate line of a display device for display updating.

2. The processing system of claim 1, wherein the rising edge comprises at least three voltage transitions and the falling edge has less than three voltage transitions.

3. The processing system of claim 1, wherein the falling edge comprises at least three voltage transitions and the rising edge has less than three voltage transitions.

4. The processing system of claim 1, wherein each of the rising edge and the falling edge comprises at least three voltage transitions.

5. The processing system of claim 1, wherein the voltage transitions of the rising edge comprise:
   a first voltage transition from a first voltage to a second voltage; and
   a second voltage transition from the second voltage to a third voltage, wherein the third voltage is greater than the second voltage and the second voltage is greater than the first voltage, wherein the voltage transitions of the falling edge comprises:
   a third transition from the third voltage to a fourth voltage, and the fourth voltage is less than the third voltage and greater than the first voltage.

6. The processing system of claim 5, wherein the fourth voltage is greater than or less than the second voltage.

7. The processing system of claim 5, wherein the second voltage is driven during a first period and the fourth voltage is driven during a second period, wherein a length of the first period differs from a length of the second period.

8. A method for generating a gate select signal, the method comprising:
   generating the gate select signal comprising a rising edge and a falling edge, wherein one or both of the rising edge and the falling edge comprises at least three voltage transitions; and
   outputting the gate select signal to gate control circuitry configured to drive the gate select signal on a gate line of a display device for display updating.

9. The method of claim 8, wherein the rising edge comprises at least three voltage transitions and the falling edge has less than three voltage transitions.

10. The method of claim 8, wherein the falling edge comprises at least three voltage transitions and the rising edge has less than three voltage transitions.

11. The method of claim 8, wherein each of the rising edge and the falling edge comprises at least three voltage transitions.

12. The method of claim 8, wherein the voltage transitions of the rising edge comprise:
    a first voltage transition from a first voltage to a second voltage; and
    a second voltage transition from the second voltage to a third voltage, wherein the third voltage is greater than the second voltage, and the second voltage is greater than the first voltage, wherein the voltage transitions of the falling edge comprises:
    a third transition from the third voltage to a fourth voltage, and wherein the fourth voltage is less than the third voltage and greater than the first voltage.

13. The method of claim 12, wherein the fourth voltage is greater than or less than the second voltage.

14. The method of claim 12, wherein the second voltage is driven during a first period and the fourth voltage is driven during a second period, wherein a length of the first period differs from a length of the second period.

15. A display device comprising:
    gate lines;
    gate control circuitry coupled to the gate lines; and
    display driver circuitry coupled to the gate control circuitry and configured to:
       generate a gate select signal comprising a rising edge and a falling edge, wherein one or both of the rising edge and the falling edge comprises at least three voltage transitions; and
       output the gate select signal to gate control circuitry configured to drive the gate select signal on a gate line of the gate lines for display updating.

16. The display device of claim 15, wherein the rising edge comprises at least three voltage transitions and the falling edge has less than three voltage transitions.

17. The display device of claim 15, wherein the falling edge comprises at least three voltage transitions and the rising edge has less than three voltage transitions.

18. The display device of claim 15, wherein each of the rising edge and the falling edge comprises at least three voltage transitions.

19. The display device of claim 15, wherein the voltage transitions of the rising edge comprise:
    a first voltage transition from a first voltage to a second voltage; and
    a second voltage transition from the second voltage to a third voltage, wherein the third voltage is greater than the second voltage, and the second voltage is greater than the first voltage, wherein the voltage transitions of the falling edge comprises:
    a third transition from the third voltage to a fourth voltage, wherein the fourth voltage is less than the third voltage and greater than the first voltage, and wherein the fourth voltage is greater than or less than the second voltage.

20. The display device of claim 15, wherein the voltage transitions of the rising edge comprise:
    a first voltage transition from a first voltage to a second voltage; and a second voltage transition from the second voltage to a third voltage, wherein the third voltage is greater than the second voltage, and the second voltage is greater than the first voltage, the second voltage is driven during a first period, wherein the voltage transitions of the falling edge comprises:

a third transition from the third voltage to a fourth voltage, wherein the fourth voltage is less than the third voltage and greater than the first voltage, and wherein the fourth voltage is driven during a second period, wherein a length of the first period differs from a length of the second period.

\* \* \* \* \*